United States Patent
Wu et al.

(10) Patent No.: US 6,732,442 B2
(45) Date of Patent: May 11, 2004

(54) PRECISE MECHANISM FOR LOAD PORT ADJUSTMENT

(75) Inventors: Yaw-Wen Wu, Tainan (TW); Tung-Gan Cheng, Tainan (TW); Tung-Liang Wua, Hsin-Chu (TW); Cheng-Chao Lin, Chia-Yi (TW); Hsueh-Cheng Lin, Hsin Chu (TW); Chia-Fu Tsai, Tainan (TW); Chih-Jung Yeh, Kaohsiung (TW); Hung-Tse Huang, Yung-Kang (TW); Ray-Wen Tsai, Yun-Lin (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/196,594

(22) Filed: Jul. 15, 2002

(65) Prior Publication Data

US 2004/0006883 A1 Jan. 15, 2004

(51) Int. Cl.⁷ .................................................. G01B 5/24
(52) U.S. Cl. ............................................ 33/502; 33/645

(58) Field of Search ........................... 33/1 M, 502, 613, 33/645

(56) References Cited

U.S. PATENT DOCUMENTS

| | | | | |
|---|---|---|---|---|
| 5,493,779 A | * | 2/1996 | Zakrajsek et al. | 33/1 M |
| 5,886,494 A | * | 3/1999 | Prentice et al. | 33/1 M |
| 6,425,280 B1 | * | 7/2002 | Ames et al. | 33/645 |
| 6,502,054 B1 | * | 12/2002 | Mooring et al. | 702/150 |

* cited by examiner

Primary Examiner—G. Bradley Bennett
(74) Attorney, Agent, or Firm—Tung & Associates

(57) ABSTRACT

An apparatus and method for adjusting the position of a load port utilized in a semiconductor wafer processing system. Generally, a door opener can be configured for opening a door through which a semiconductor wafer may enter for subsequent positioning and processing thereof by a semiconductor wafer processing system. A load port is associated with the door opener. A calibration mechanism can then be utilized for calibrating the load port for leveling and height positioning, such that a plurality of directional axis associated with the load port do not interfere with one another, thereby conserving calibration time while permitting a single individual to perform calibration operations thereof.

20 Claims, 4 Drawing Sheets

PRECISE MECHANISM FOR LOAD PORT ADJUSTMENT

TECHNICAL FIELD

The present invention relates generally to semiconductor wafer processing systems and devices. The present invention also relates to over head transport (OHT) systems and devices utilized in semiconductor wafer processing operations. The present invention additionally relates to door opener and load ports thereof utilized in semiconductor wafer processing operations. In addition, the present invention relates to devices and methods for adjusting and calibrating such load ports.

BACKGROUND OF THE INVENTION

The fabrication of electronic devices on substrates is typically performed utilizing semiconductor processing devices and systems. Such semiconductor processing devices and systems can take on various implementations, including single wafer systems and batch type systems. Single wafer systems or devices involve the processing of a single wafer in a processing chamber. Batch type systems or devices involve the processing of multiple wafers in a chamber apparatus. Despite system or device architecture disparities, substrates are generally delivered to the processing systems from a clean room utilizing standardized interfaces and wafer pods or cassettes.

Such systems are commonly utilized in the semiconductor manufacturing industry. Such systems may be entirely automated or may include human interaction. The level of human interaction with such systems can be a contributing factor to costs involved in the overall semiconductor fabrication process. In most systems, a human operator or factory automation can deliver multiple wafers loaded in wafer pods or cassettes to a loading mechanism which transfers the wafers from the clean room in a fabrication facility into the processing system without exposing the wafers to contaminants. The delivery of wafers between processing systems and the operation of pod doors has been standardized by an organization known as SEMI.

Recent advances in circuit design and processing technology have driven a significant decrease in the size of semiconductor devices. At the same time, chip makers are trying to increase the number of devices, which can be produced on a single wafer. Accordingly, wafer sizes have increased to 300 mm, thereby requiring larger systems, which increase the amount of fabrication facility floor space required to house the larger systems. Also, as the wafer size has increased, the handling of wafers has become more limited to factory automation, instead of manual handling, to accommodate the increase in size and weight of wafer pods.

FIG. 1 is a schematic top view of a representative prior art processing system 10 having a front-end staging area 12, which mounts a plurality of wafer pod loading stations 14 through an interface wall 16 separating the clean room 18 from the gray area 20 where the processing system 10 is housed. A single wafer processing system may include one or more load lock chambers 22, a central transfer chamber 24 and a plurality of processing chambers 26 mounted on the transfer chamber.

A robot 28 disposed in the front-end staging area 12 moves wafers from wafer pods disposed on the pod loading stations 14 into a load lock chamber 22. A robot 30 disposed in the transfer chamber 24 moves wafers from a load lock chamber 22 into a processing chamber 26. The pod loading stations 14 are generally disposed through an opening in the interface wall 16 and provide a movable door opener 32, which can seal the opening in the interface wall 16 when a wafer pod is not positioned on the pod loading station 14. An example of a movable door opener currently in use is the Applied Materials Door Opener (ADO) manufactured by Applied Materials, Inc. of Santa Clara, Calif. Note that the configuration depicted in FIG. 1 is presented herein for illustrative purposes only and is not considered a limiting feature of the present invention.

There are several commercial pod loading stations available from manufacturers, such as Jenoptik/INFAB, ASYST, PRI Automation and DYFUKU. These pod loading stations are very similar in function and appearance as they are all designed to meet applicable SEMI standards for the interface to the processing system as well as the interface to the pod and the pod loading station as presented to the fabrication facility material transport system (AGV, OHT, PGV). These current designs share the following details: a mechanical interface to receive a pod using three pins as required by SEMI; a mechanism to latch the pod into place on the pod loader; a mechanism to grip a pod door and operate the pod door latch mechanism; and, a mechanism to remove the pod door and store the door out of the way of the pod opening to allow clear access to the wafers stored inside the pod. These existing designs all generally employ a mechanical motion, which latches the pod to a fixed position, grips and unlatches the pod door, pulls the pod door horizontally away from the pod (i.e., into the staging area 12), and then lowers the pod door below the plane of the pod for storage of the door while allowing access to all wafer positions. The pod loading stations 14 are designed so that an operator or factory automation can deliver a wafer pod onto the pod loading station and the wafers can be unloaded into the semiconductor wafer processing system.

Based on the foregoing, it can be appreciated that in most over head transport (OHT) systems, SEMI standards must be met, including height, leveling, side-to-side, and front-to-back positioning. One of the problems with current OHT systems thus involves positioning. The ADO load port, for example, has a very rough, and simple mechanism for adjusting position, and also has few tolerances to adjusting the height and leveling position. In addition, such an ADO mechanism is difficult for adjusting the load port position. Fine tuning of the load port position can not be achieved. Calibration of such ADO mechanisms generally requires a great deal of time to calibrate the load port position. Additionally, the ADO mechanism requires at least two individuals to calibrate the load port position.

The present inventors have thus concluded that a need exists for a new mechanism, including a method thereof, for fine tuning the load port position. A precise and "smart" load port adjusting mechanism is thus required, including one that can handle larger tolerances for load port adjustments. In addition, it would be desirable to implement a load port adjusting mechanism that requires only one person to perform the adjustment and which also saves calibration time. The present inventors have overcome the drawbacks associated with prior art devices, such as the ADO mechanism by presenting an improved load port adjusting mechanism including a method thereof, which is disclosed and described herein.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor wafer processing apparatus and method.

It is yet another aspect of the present invention to provide an improved load port utilizing in semiconductor wafer processing operations.

It is still another aspect of the present invention to provide a calibration mechanism for load port adjustment.

It is also an aspect of the present invention to provide an improved calibration mechanism for fine tuning the position of a load port, including the height level, side-to-side and front-to-back positions of the load port.

The above and other aspects of the present invention can thus be achieved as is now described. An apparatus and method for adjusting the position of a load port utilized in a semiconductor wafer processing system is described herein. Generally, a door opener can be configured for opening a door through which a semiconductor wafer may enter for subsequent positioning and processing thereof by a semiconductor wafer processing system. A load port is associated with the door opener. A calibration mechanism can then be utilized for calibrating the load port for leveling and height positioning, such that a plurality of directional axis associated with the load port do not interfere with one another, thereby conserving calibration time while permitting a single individual to perform calibration operations thereof.

Such directional axis associated with the load port comprise a Y-axis and a Z-axis. The calibration mechanism thus comprises an adjusting mechanism for fine tuning one or more positions of the load port. The calibration mechanism comprises a screw assembly, and a receiver for receiving the screw assembly, wherein the receiving area forms a slot through which the screw assembly may move, such that the screw assembly moves through the slot to assist in a calibration of the load port by the calibration mechanism. The screw assembly can be configured to include a top screw associated with the screw assembly, wherein the top screw is utilized to pull or push the screw assembly from or into the slot. A plurality of walls may form at least two additional slots, which limit the sliding of the screw assembly into such additional slots. Also, at least two linkages are generally connected to the screw assembly, wherein the linkages transfer force to the load port during a side-to-side calibration of the load port by the calibration mechanism.

The calibration mechanism can be configured to generally include a y-directional screw bar surrounded by a cover, and a ball-pillar connected to the y-directional screw bar. The calibration mechanism also can includes a plurality of walls forming at least one slide slot, a z-directional screw bar integrated surrounded by a sleeve thereof, a screw connected to at least one slide located within slide slot, and at least one linkage connecting the z-directional screw bar to the slide. The semiconductor wafer processing system comprises an over head transport (OHT) system. The calibration mechanism generally comprises an adjusting mechanism for adjusting a height and a level of the load port, wherein the load port is associated with the OHT system.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
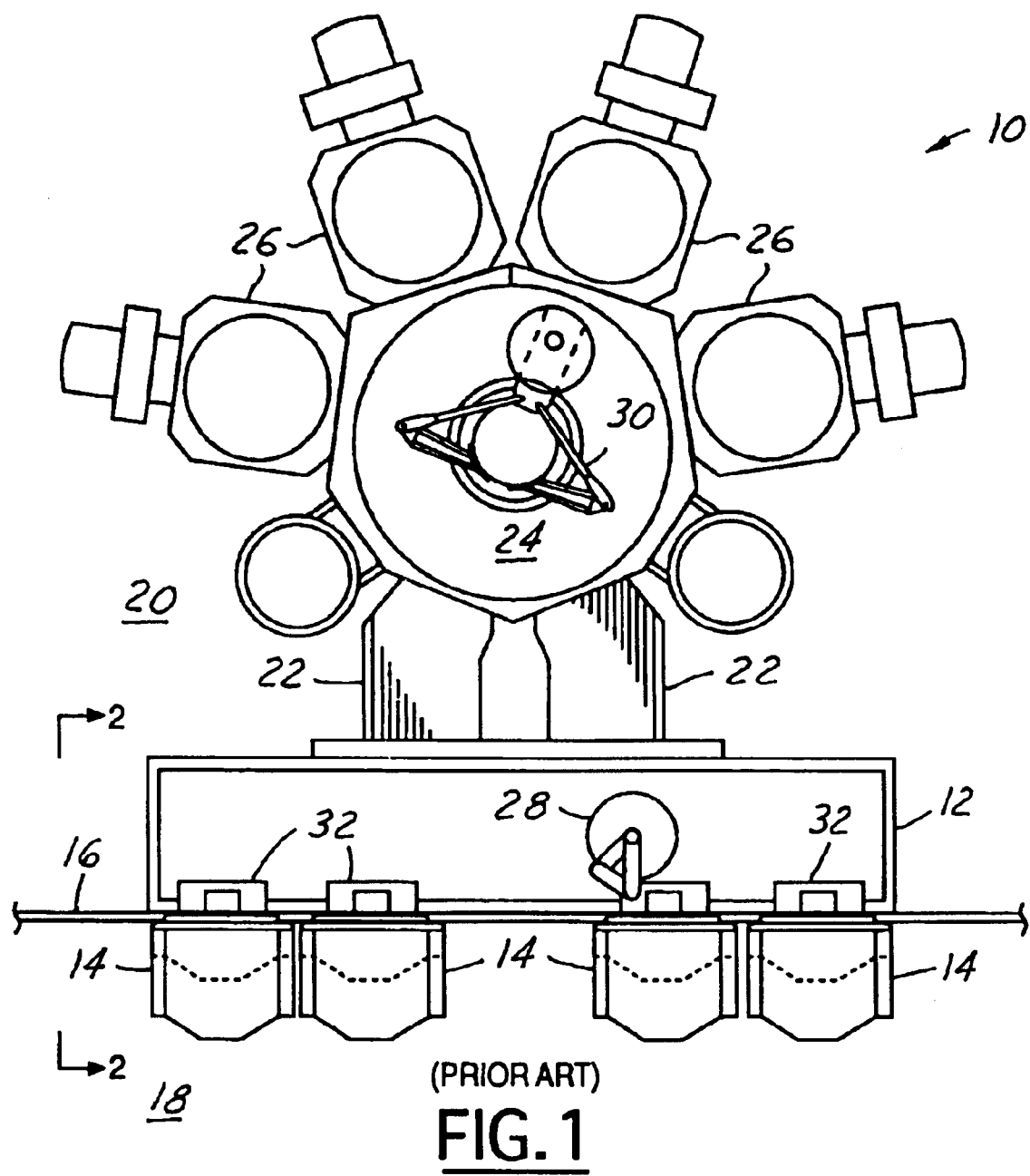
FIG. 1 depicts a schematic top view of a representative prior art semiconductor wafer processing system.
Figure 2:
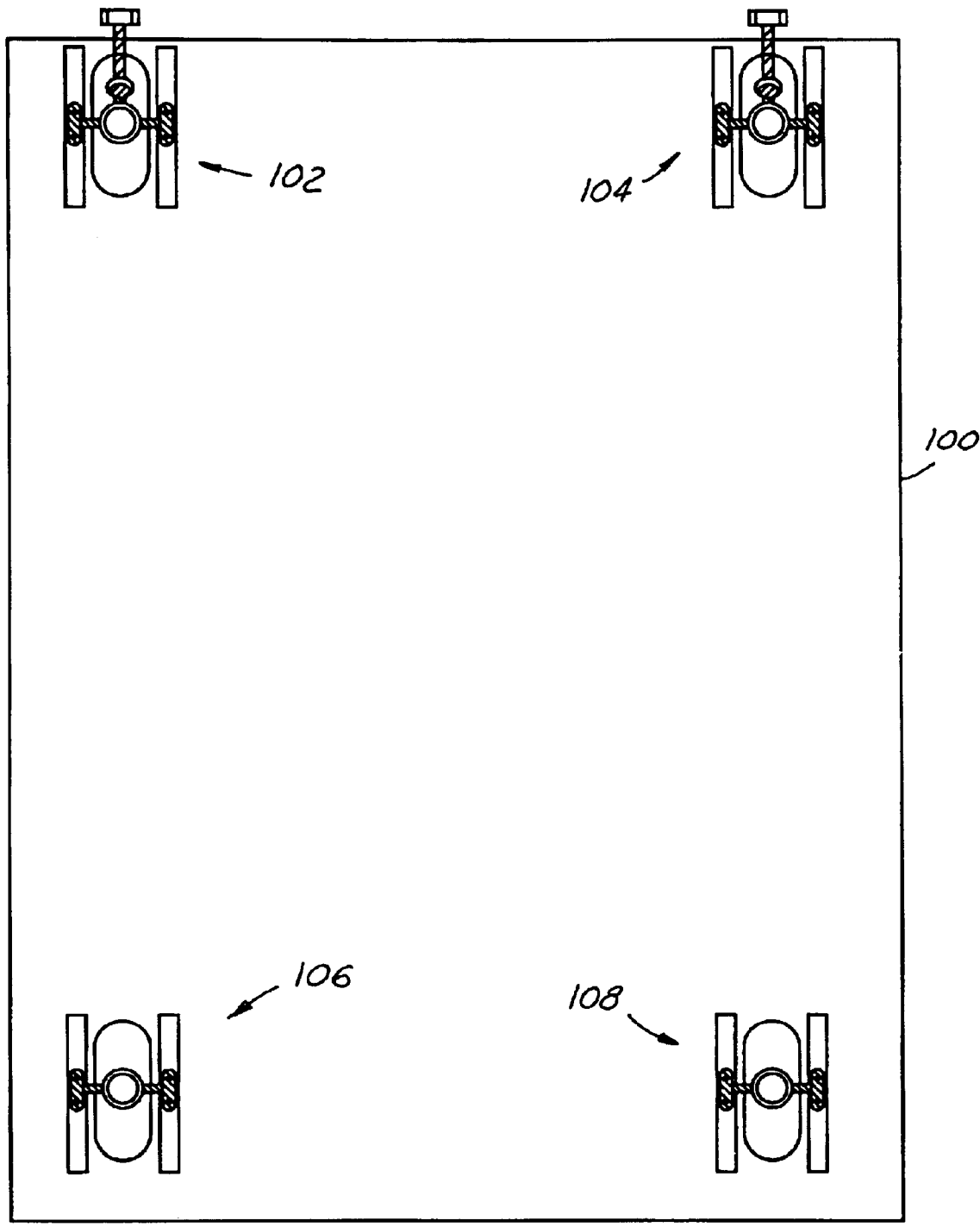
FIG. 2 illustrates a front view of a door opener load port, in accordance with a preferred embodiment of the present invention.

FIG. 2 illustrates a front view of a door opener load port 100, in accordance with a preferred embodiment of the present invention. Such a door opener may, for example, be an ADO load port, as described earlier. Such an ADO load port can be modified and improved upon, as described and claimed herein. Load port 100 includes a plurality of calibration mechanisms 102, 104, 106, and 104. Generally, such calibration mechanisms provide fine tune load port leveling, including independent adjustments, such that the Y-axis and Z-axis do not interfere with one another. An ADO is one example of a door opener or door opening mechanism that may be utilized in accordance with the apparatus and method of the present invention. As such an ADO device is not considered a limiting feature of the present invention.

Figure 3:
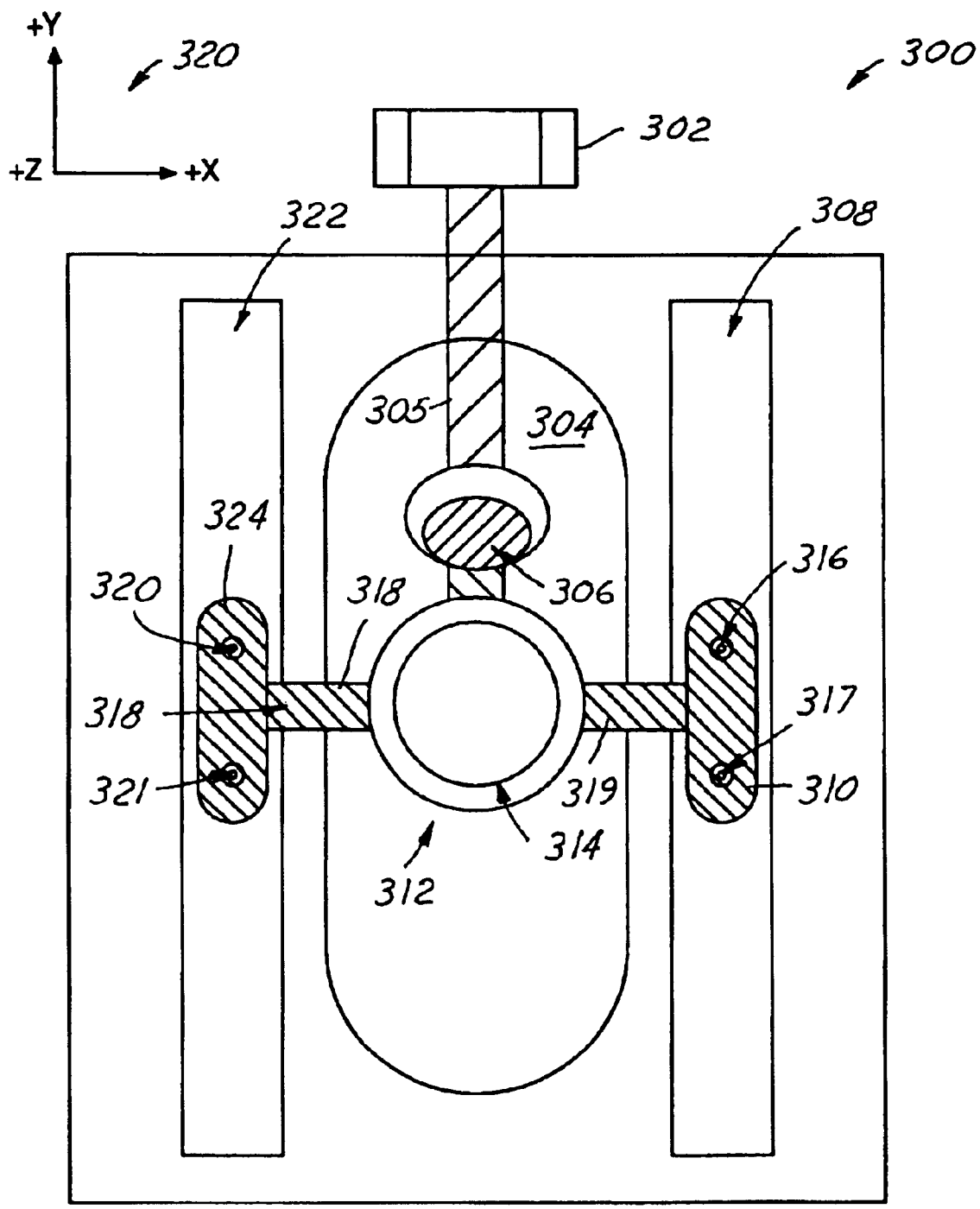
FIG. 3 depicts a front view of a door opener fine tuning mechanism, which may be implemented in accordance with a preferred embodiment of the present invention.

FIG. 3 depicts a front view of a door opener fine tuning mechanism 300, which may be implemented in accordance with a preferred embodiment of the present invention. Mechanism 300 of FIG. 3 is generally configured as a calibration mechanism analogous to calibration mechanisms 102, 104, 106 and 108 of FIG. 2. As illustrated in FIG. 3, a directional diagram 320 illustrates Y, Z and X axis directions. A screw-bar-y 302 is generally connected to a ball-pillar 306. Both bar-pillar 306 and a portion 305 of screw-bar-y 302 are maintained within a cover 304. A sleeve 312 generally surrounds screw-bar-z 314. A linkage 319 is generally connected to a slide 310, which is located within a slide-slot 308. Screws 316 and 317 generally maintain slide 310 within slide-slot 308. Similarly, a slide-slot 322 surrounds a slide 324, which is connected by linkage 318 to sleeve 312. Screws 320 and 321 maintain slide 324 within slide-slot 322.

Figure 4:
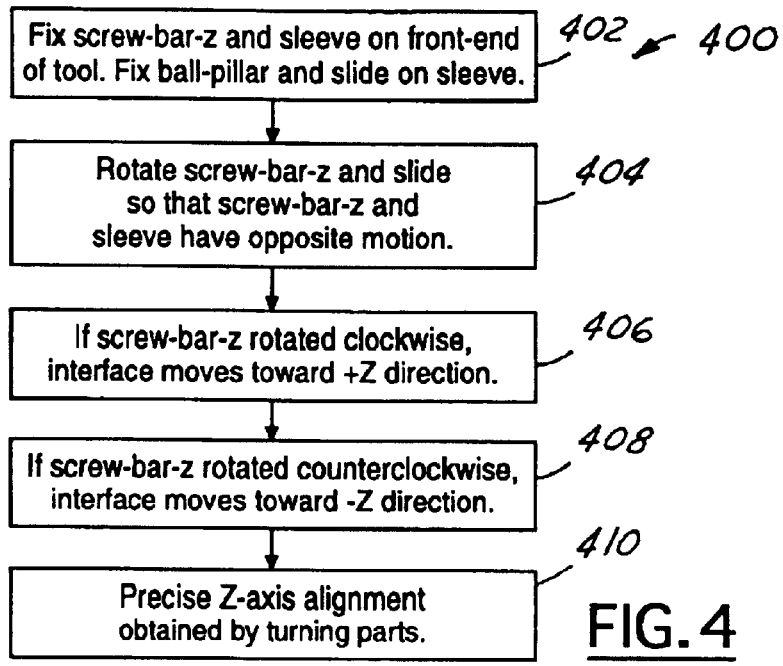
FIG. 4 illustrates a flow chart of operations illustrating logical operational steps that may be implemented to calibrate a front door opener in a Z-direction, in accordance with a preferred embodiment of the present invention.

FIG. 4 illustrates a flow chart 400 of operations illustrating logical operational steps that may be implemented to calibrate a front door opener in a Z-direction, in accordance with a preferred embodiment of the present invention. Thus, to calibrate in the Z-direction, initially screw-bar-z 314 and sleeve 312 are fixed on the front-end of a tool, while ball-pillar 306 and slide 310 are fixed on sleeve 312, as illustrated at block 402. As indicated next at block 404, screw-bar-z 314 and slide 310 are generally rotated so that screw-bar-z 314 and sleeve 312 will have an opposite motion, thereby transferring force from the rotation of screw-bar-z 314 to linkage 319. As illustrated next at block 406, if screw-bar-z 314 is rotated clockwise, an associated interface will move toward the +Z direction. As illustrated at block 408, if screw-bar-z 314 is rotated counterclockwise, the load port interface will move toward the –Z direction. As indicated at block 410, precise Z-axis aligned can thus be obtained by turning the aforementioned parts.

Figure 5:
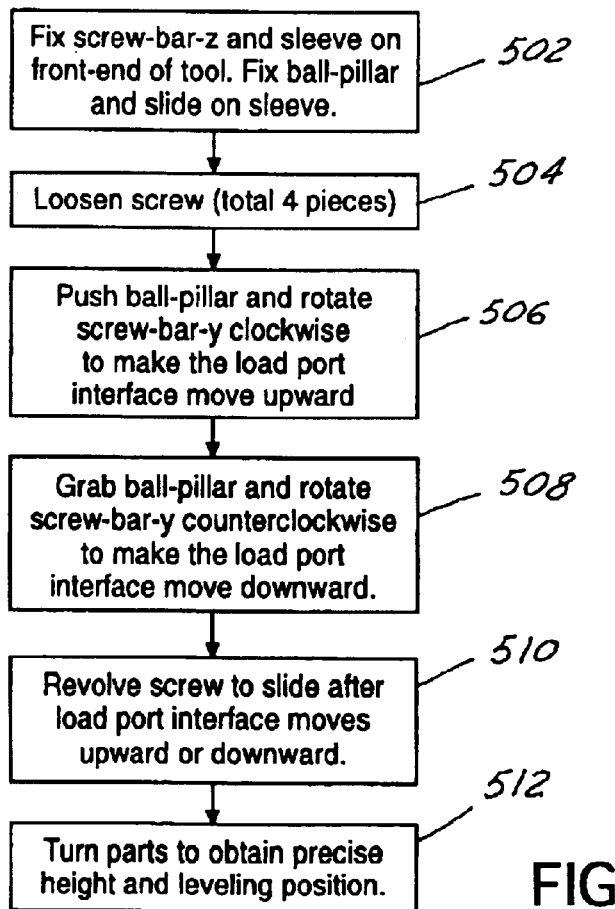
FIG. 5 depicts a flow chart of operations illustrating logical operational steps that may be implemented to calibrate a front door opener in a Y-direction, in accordance with a preferred embodiment of the present invention.

FIG. 5 depicts a flow chart 500 of operations illustrating logical operational steps that may be implemented to calibrate a front door opener in a Y-direction, in accordance with a preferred embodiment of the present invention. To calibrate in the Y-direction, screw-bar-z 314 and sleeve 312 may be fixed on the front end of an associated tool and ball pillar 306 and slide 310 fixed on sleeve 312, as indicated at block 502. As illustrated next at block 504, screws 316, 310 and screws 320, 321 may be loosened (i.e., a total of four pieces). Next, as depicted at block 506, ball-pillar 306 may be pushed and screw-bar-y 302 rotated clockwise resulting in the upward movement of the load port interface. As illustrated at block 508, ball-pillar 306 may be grabbed and screw-bar-y 302 rotated counterclockwise, resulting the downward movement of the load port interface. Thereafter, as depicted at block 310, after the load port is made to move upward or downward, screw 316 can be revolved to fix slide 310. Thus, as indicated at block 512, turning the aforementioned parts can obtain precise heigh and leveling position.

Based on the foregoing, it can be appreciated that the present invention described herein discloses an apparatus and method for adjusting the position of a load port utilized in a semiconductor wafer processing system is described herein. An example of such a load port is the ADO load port described earlier. Generally, a door opener, such as for example, an ADO, can be configured for opening a door through which a semiconductor wafer may enter for subsequent positioning and processing thereof by a semiconductor wafer processing system. The load port is generally associated with the door opener. A calibration mechanism can then be utilized to calibrate the load port for leveling and height positioning, such that a plurality of directional axis associated with the load port do not interfere with one another. Such an arrangement conserves calibration time while permitting a single individual to perform calibration operations thereof.

The directional axis associated with the load port comprises a Y-axis and a Z-axis. The calibration mechanism thus comprises an adjusting mechanism for fine tuning one or more positions of the load port. The calibration mechanism comprises a screw assembly, and a receiver for receiving the screw assembly, wherein the receiving area forms a slot through which the screw assembly may move, such that the screw assembly moves through the slot to assist in a calibration of the load port by the calibration mechanism. The screw assembly can be configured to include a top screw associated with the screw assembly, wherein the top screw is utilized to pull or push the screw assembly from or into the slot. A plurality of walls may form at least two additional slots, which limit the sliding of the screw assembly into such additional slots. Also, at least two linkages are generally connected to the screw assembly, wherein the linkages transfer force to the load port during a side-to-side calibration of the load port by the calibration mechanism.

The calibration mechanism can be configured to generally include a y-directional screw bar surrounded by a cover, and a ball-pillar connected to the y-directional screw bar. The calibration mechanism also can includes a plurality of walls forming at least one slide slot, a z-directional screw bar integrated surrounded by a sleeve thereof, a screw connected to at least one slide located within slide slot, and at least one linkage connecting the z-directional screw bar to the slide. The semiconductor wafer processing system comprises an over head transport (OHT) system. The calibration mechanism generally comprises an adjusting mechanism for adjusting a height and a level of the load port, wherein the load port is associated with the OHT system.

The calibration mechanism described herein thus permits a precise and "smart" position to be obtained, including front-to-back, and side-to-side leveling. The height can also be adjusted accordingly. Larger tolerances can be provided by adjusted the load port heigh (i.e., the Y-direction). Thus, the present invention describes a calibration mechanism that provides efficient and easy load port leveling capabilities. In addition, independent adjustments are practical utilizing the calibration mechanism described herein, such that the Y-Axis and Z-Axis do not interfere with one another. Thus, only one individual may be required to perform the adjustments utilizing the calibration mechanism described herein. This in turn can save calibration time and associated costs.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. An apparatus for adjusting the position of a load port utilized in a semiconductor wafer processing system, said apparatus comprising:

a door opener for opening a door through which a semiconductor wafer may enter for subsequent positioning and processing thereof by a semiconductor wafer processing system;

a load port of said semiconductor wafer processing system, wherein said load port is associated with said door opener;

a calibration mechanism for calibrating said load port for leveling and height positioning, such that a plurality of directional axis associated with said load port do not interfere with one another, thereby conserving calibration time while permitting a single individual to perform calibration operations thereof.

2. The apparatus of claim 1 wherein said plurality of directional axis associated with said load port comprises:

a Y-axis; and a Z-axis.

3. The apparatus of claim 1 wherein said calibration mechanism further comprises:

an adjusting mechanism for fine tuning a position of said load port.

4. The apparatus of claim 1 wherein said calibration mechanism comprises:
a screw assembly;
a receiver for receiving said screw assembly, wherein said receiving area forms a slot through which said screw assembly may move, such that said screw assembly moves through said slot to assist in a calibration of said load port by said calibration mechanism.

5. The apparatus of claim 4 wherein said screw assembly comprises:
a top screw associated with said screw assembly, wherein said top screw is utilized to pull or push the screw assembly from or into said slot.

6. The apparatus of claim 4 further comprising:
a plurality of walls forming at least two additional slots which limit a sliding of said screw assembly into said at least two additional slots.

7. The apparatus of claim 4 further comprising
at least two linkages connected to said screw assembly, wherein said at least two linkages transfer force to said load port during a side-to-side calibration of said load port by said calibration mechanism.

8. The apparatus of claim 1 wherein said calibration mechanism comprises:
a y-directional screw bar surrounded by a cover;
a ball-pillar connected to said y-directional screw bar;
a plurality of walls forming a slide slot;
a z-directional screw bar integrated surrounded by a sleeve thereof;
a screw connected to a slide located within said slide slot; and
a linkage connecting said z-directional screw bar to said slide.

9. The apparatus of claim 1 wherein said semiconductor wafer processing system comprises an over head transport (OHT) system.

10. The apparatus of claim 8 wherein said calibration mechanism comprises:
an adjusting mechanism for adjusting a height and a level of said load port, wherein said load port is associated with said OHT system.

11. A method for adjusting the position of a load port utilized in a semiconductor wafer processing system, said method comprising the steps of:
opening a door via a door opener, wherein a semiconductor wafer may enter said door for subsequent positioning and processing thereof by a semiconductor wafer processing system;
associating a load port with said door opener; and
calibrating said load port utilizing a calibrating mechanism for leveling and height positioning, such that a plurality of directional axis associated with said load port do not interfere with one another, thereby conserving calibration time while permitting a single individual to perform calibration operations thereof.

12. The method of claim 11 wherein said plurality of directional axis associated with said load port comprises:
a Y-axis; and
a Z-axis.

13. The apparatus of claim 11 further comprising the step of:
fine tuning a position of said load port utilizing said calibration mechanism.

14. The method of claim 11 further comprising the step of:
configuring said calibration mechanism to comprise:
a screw assembly; and
a receiver for receiving said screw assembly, wherein said receiving area forms a slot through which said screw assembly may move, such that said screw assembly moves through said slot to assist in a calibration of said load port by said calibration mechanism.

15. The method of claim 14 further comprising the step of:
configuring said screw assembly to comprise a top screw associated with said screw assembly, wherein said top screw is utilized to pull or push the screw assembly from or into said slot.

16. The method of claim 14 further comprising the step of:
modifying a wall to form an additional slot which limit a sliding of said screw assembly into said additional slot.

17. The method of claim 14 further comprising the step of:
connecting a linkage to said screw assembly, wherein said linkage transfers force to said load port during a side-to-side calibration of said load port by said calibration mechanism.

18. The method of claim 11 further comprising the step of:
configuring said calibration mechanism to comprise:
a y-directional screw bar surrounded by a cover;
a ball-pillar connected to said y-directional screw bar;
a wall forming a slide slot;
a z-directional screw bar integrated surrounded by a sleeve thereof;
a screw connected a slide located within said slide slot; and
a linkage connecting said z-directional screw bar to said at least one slide.

19. The method of claim 11 further comprising the steps of:
configuring said semiconductor wafer processing system to comprise an over head transport (OHT) system; and
adjusting a height and level of said load port utilizing said calibration mechanism, wherein said load port is associated with said OHT system.

20. An apparatus for adjusting the position of a load port utilized in a semiconductor wafer processing system, said apparatus comprising:
a door opener for opening a door through which a semiconductor wafer may enter for subsequent positioning and processing thereof by a semiconductor wafer processing system, wherein said door opener is associated with a load port of semiconductor wafer processing system;
a calibration mechanism for calibrating said load port for leveling and height positioning, such that a plurality of directional axis associated with said load port do not interfere with one another, thereby conserving calibration time while permitting a single individual to perform calibration operations thereof; and
wherein said calibration mechanism further comprises an adjusting mechanism for fine tuning a position of said load port, such that said calibration mechanism includes a screw assembly, a receiver for receiving said screw assembly, wherein said receiving area forms a slot through which said screw assembly may move, such that said screw assembly moves through said slot to assist in calibration of said load port by said calibration mechanism.

* * * * *